United States Patent [19]
Hagiwara et al.

[11] Patent Number: 6,143,475
[45] Date of Patent: Nov. 7, 2000

[54] POLYIMIDE PRECURSOR, POLYIMIDE AND THEIR USE

[75] Inventors: Hideo Hagiwara, Ibaraki-ken; Yasunori Kojima; Makoto Kaji, both of Hitachi; Mitsumasa Kojima, Niiza; Haruhiko Kikkawa, Yokohama, all of Japan

[73] Assignee: Hitachi Chemical Co., Tokyo, Japan

[21] Appl. No.: 09/083,056

[22] Filed: May 22, 1998

Related U.S. Application Data

[62] Division of application No. 08/630,478, Apr. 10, 1996.

[30] Foreign Application Priority Data

Apr. 13, 1995 [JP] Japan ..................................... 7-088059

[51] Int. Cl.$^7$ .............................. G03F 7/36; G03F 7/012
[52] U.S. Cl. ......................... 430/313; 430/197; 430/317; 430/325; 430/330
[58] Field of Search .................... 430/317, 323, 430/330, 313, 325, 197

[56] References Cited

U.S. PATENT DOCUMENTS

| | | | |
|---|---|---|---|
| 4,416,973 | 11/1983 | Goff ....................................... | 430/283.1 |
| 4,548,891 | 10/1985 | Riediker et al. ...................... | 430/283.1 |
| 4,579,809 | 4/1986 | Irving .................................... | 430/283.1 |
| 4,783,391 | 11/1988 | Ohbayashi et al. .................... | 430/197 |
| 5,025,088 | 6/1991 | Maeda et al. ......................... | 430/283.1 |
| 5,043,248 | 8/1991 | Uekita et al. ......................... | 430/283.1 |
| 5,087,550 | 2/1992 | Blum et al. ............................ | 430/197 |
| 5,238,784 | 8/1993 | Tokoh et al. ........................... | 430/197 |
| 5,348,835 | 9/1994 | Oba et al. .............................. | 430/197 |
| 5,378,420 | 1/1995 | Harris et al. . | |
| 5,385,808 | 1/1995 | Tokoh et al. ......................... | 430/283.1 |
| 5,399,460 | 3/1995 | Aldrich et al. ....................... | 430/287.1 |
| 5,856,059 | 1/1999 | Hagiwara et al. ..................... | 430/196 |

OTHER PUBLICATIONS

Makromolekulare Chemie, Macromolecular Chemistry and Physics, vol. 195, 1906–1994, Basel CH, pp. 2207–2225, Eashoo, et al.; "High Performance Aromatic Polyimide Fibers" p. 2208.
Patent Abstracts of Japan, vol. 97 (C–1167), Feb. 17, 1994.
Patent Abstracts of Japan, vol. 77 (P–62), May 21, 1981.

*Primary Examiner*—John S. Chu
*Attorney, Agent, or Firm*—Antonelli, Terry, Stout & Kraus, LLP

[57] ABSTRACT

A polyimide precursor having repeating units of the formula:

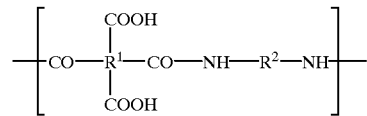

wherein $R^1$ is a tetravalent organic group; and $R^2$ is a divalent diphenyl group, is excellent in image formation and particularly suitable for forming a pattern using an i-line stepper, and gives a photosensitive resin composition by imparting photosensitivity to the polyimide precursor, said photosensitive resin composition being suitable for forming surface protective films for semiconductor devices or interlaminar insulating films for multilayer wiring boards.

22 Claims, No Drawings

POLYIMIDE PRECURSOR, POLYIMIDE AND THEIR USE

This application is a Divisional application of application Ser. No. 08/630,478, filed Apr. 10, 1996, allowed.

BACKGROUND OF THE INVENTION

This invention relates to a polyimide precursor, a process for producing the polyimide precursor, a polyimide, a process for producing the polyimide, a photosensitive composition, a process for using the photosensitive composition in the production of semiconductor devices, etc., and a semiconductor device and production thereof.

In semiconductor industry, inorganic materials have been used as interlaminar insulating materials. But recently, organic materials having excellent heat resistance such as polyimide resins and the like are used as interlaminar insulating materials by using their properties.

On the other hand, semiconductor integrated circuit pattern formation and circuit pattern formation on printed circuit substrates are carried out by various complicated steps, for example, forming a film of resist material on a substrate, exposing predetermined portions to light, removing unnecessary portions by etching and the like, cleaning the substrate surface, etc. In such a process, it is desirable to use a resist on necessary portions as it is as an insulating material after the pattern formation by exposure to light and development. Thus, the development of heat resistant photosensitive materials for such a purpose are demanded.

In order to meet such a demand, there are proposed heat resistant photosensitive materials using photosensitive polyimides, ring-closed polybutadienes, etc. as base polymers. Particularly the photosensitive polyimides are noticed due to excellent heat resistance and easiness of removable of impurities.

For example, JP-B 49-17374 proposed a material comprising a polyimide precursor and a bichromate. This material had advantages in practical photosensitivity and high film-forming ability, but also disadvantages in storage stability and retention of chromium ions in the polyimide. Thus, such a material was not used practically.

In order to avoid such problems, JP-A 54-109828 proposed a process for mixing a compound having a photosensitive group with a polyimide precursor. Further, JP-A 56-24343 and JP-A 60-100143 proposed processes for providing photosensitive groups by reacting a functional group in a polyimide precursor with a functional group in a compound having a photosensitive group. These photosensitive polyimide precursors use as a fundamental skeleton an aromatic monomer which is excellent in heat resistance and mechanical properties. But due to absorption of the polyimide precursors per se, light transmittance in the ultraviolet region becomes low and photochemical reaction on exposed portions is not carried out sufficiently effectively, resulting in providing problems such as low sensitivity and worsened pattern shape.

With recent tendency of higher integration of semiconductors, higher resolution (or smaller processing rule) is also demanded.

In order to meet such a demand, a contact/proximity exposing device using a parallel light previously used is going to be replaced by a 1:1 projection exposing device which is called by "a mirror projection", or a so-called "stepper" which is a reducing projection exposing device. The stepper uses a high output oscillation line of ultra-high pressure mercury lamp and monochromatic light such as excimer laser light. As the stepper, a g-line stepper which uses a visible light (wavelength 435 nm) of g-line of ultra-high pressure mercury lamp was used mainly. But in order to meet the demand for higher resolution, it is necessary to make the wavelength used in the stepper shorter. Thus, the g-line stepper (wavelength 435 nm) is going to be replaced by an i-line stepper (wavelength 365 nm).

On the other hand, known photosensitive polyimide are designed for the contact/proximity exposing device, the mirror projection exposing device, and the g-line stepper. But such polyimides are low in transparency and show almost no transmittance when the i-line (wavelength 365 nm) is used. Therefore, no sufficient pattern can be obtained when the i-line stepper is used.

Further, in order to meet the LOC (lead on chip) wherein a high density mounting method of semiconductor is used, a polyimide film for surface protection is required to have a thicker film thickness. When the film thickness becomes larger, the problem of low transmittance becomes severer.

Furthermore, a diameter of a silicon wafer becomes larger every year. To the contrary, a thickness of a silicon wafer has a tendency to become smaller. On the other hand, a thickness of a polyimide film becomes larger every year due to the mounting method mentioned above. Accordingly, a warp of a silicon wafer having a polyimide surface protective film thereon is occured due to the difference of thermal expansivity between the polyimide film and the silicon wafer. Therefore, a photosensitive polyimide having lower thermal expansivity is strongly required.

SUMMARY OF THE INVENTION

It is an object of the present invention to provide a polyimide precursor overcoming the problems of prior art and having excellent image forming properties, being suitable for patterning using an i-line stepper, and showing excellent mechanical properties, heat resistance, adhesiveness after thermal curing, and a process for producing the same.

It is another object of the present invention to provide a polyimide, a process for producing the same and a photosensitive resin composition containing a polyimide precursor.

It is a further object of the present invention to provide a semiconductor device using the polyimide mentioned above, and a process for producing the same.

The present invention provides a polyimide precursor (i.e. poly(amic acid)) having repeating units of the formula:

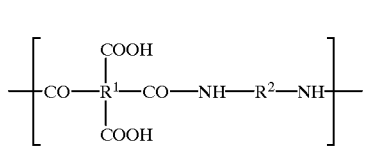

(I-1)

wherein $R^1$ is a tetravalent organic group; and $R^2$ is a group of the formula:

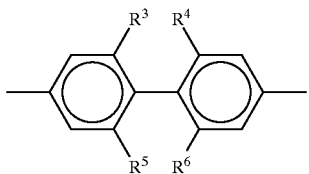

(II)

wherein $R^3$, $R^4$, $R^5$ and $R^6$ are independently a hydrogen atom or a monovalent organic group, and at least two of $R^3$ to $R^6$ are independently a monovalent organic group.

The present invention also provides a process for producing the above-mentioned polyimide precursor which comprises reacting a tetracarboxylic acid or a derivative thereof with a diamine of the formula:

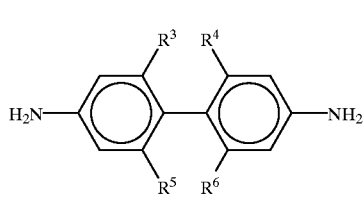

(III)

wherein $R^3$, $R^4$, $R^5$ and $R^6$ are as defined above.

The present invention further provides a polyimide having repeating units of the formula:

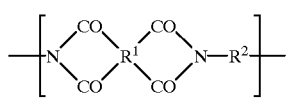

(I-2)

wherein $R^1$ and $R^2$ are as defined above.

The present invention still further provides a process for producing the polyimide mentioned above, which comprising subjecting the above-mentioned polyimide precursor to imide ring closure.

The present invention also provides a photosensitive resin composition containing the above-mentioned polyimide precursor, a semiconductor device obtained by using the photosensitive resin composition, and a process for producing the semiconductor device, which comprises forming a polyimide pattern on a substrate as a mask, conducting dry etching, and subjecting to passivation processing.

DESCRIPTION OF THE PREFERRED EMBODIMENTS

The polyimide precursor of the present invention has repeating units of the formula:

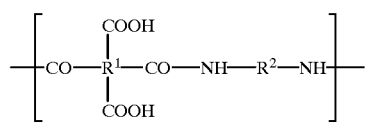

(I-1)

wherein $R^1$ is a tetravalent organic group; and $R^2$ is a group of the formula:

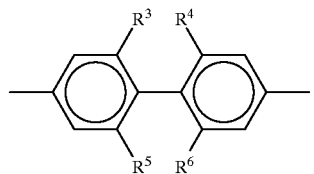

(II)

wherein $R^3$, $R^4$, $R^5$ and $R^6$ are independently a hydrogen atom or a monovalent organic group, and at least two of $R^3$ to $R^6$ are independently a monovalent organic group.

When the tetravalent organic group of $R^1$ in the formula (I-1) is, preferably an aromatic group, for example, a group of the formula:

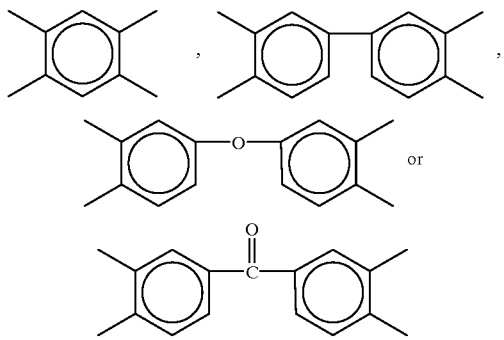

mechanical properties of the resulting film are improved. Among them, the group of the formula:

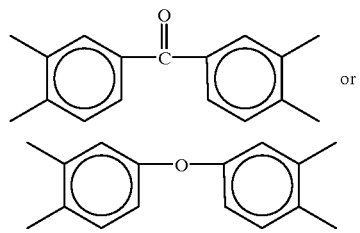

is more preferable.

In the formula (I-1), $R^2$ is represented by the formula (II), wherein $R^3$, $R^4$, $R^5$ and $R^6$ are independently a hydrogen atom or a monovalent organic group, and at least two of $R^3$ to $R^6$ are independently a monovalent organic group.

When the monovalent organic groups of $R^3$ to $R^6$ are independently an alkyl group preferably having 1 to 5 carbon atoms, a halogenated alkyl group preferably having 1 to 5 carbon atoms (e.g. $-CF_3$, $-CF_2CF_2H$), an alkoxy group preferably having 1 to 5 carbon atoms, or a halogenated alkoxy group preferably having 1 to 5 carbon atoms (e.g. $-OCF_3$, $-OCF_2CF_2H$), transmittance of i-line and thermal properties of the resulting film are improved. Among of these monovalent organic groups, the alkyl group is preferable.

Preferable examples of $R^2$ in the formula (I-1) are as follows:

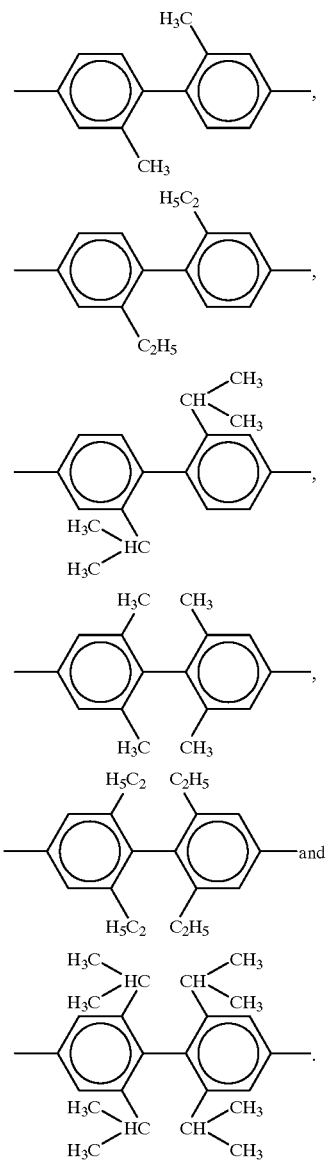

in order to improve light transmittance and mechanical properties and thermal properties of the resulting film.

Among them, the group of the formula:

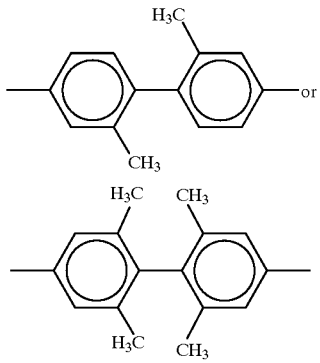

is more preferable.

The above-mentioned polyimide precursor can be synthesized by reacting a tetracarboxylic acid or a derivative thereof with a diamine of the formula:

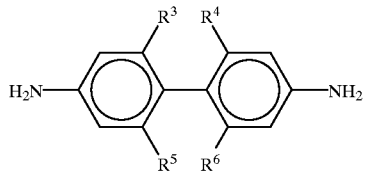

(III)

if necessary in an organic solvent, preferably at −20° C. to 100° C., more preferably 0° C. to 90° C., particularly preferably 15° C. to 50° C.

As the tetracarboxylic acid, there can be used aromatic tetracarboxylic acid such as oxydiphthalic acid, pyromellitic acid, 3,3',4,4'-benzophenonetetracarboxylic acid, 3,3',4,4'-biphenyltetracarboxylic acid, 1,2,5,6-naphthalenetetracarboxylic acid, 2,3,6,7-naphthalenetetracarboxylic acid, 1,4,5,8-naphthalenetetracarboxylic acid, 2,3,5,6-pyridinetetracarboxylic acid, 3,4,9,10-perylenetetracarboxylic acid, sulfonyldiphthalic acid, m-terphenyl-3,3',4,4'-tetracarboxylic acid, p-terphenyl-3,3', 4,4'-tetracarboxylic acid, 1,1,1,3,3,3-hexafluoro-2,2-bis(2,3- or 3,4-dicarboxyphenyl)propane, 2,2-bis(2,3- or 3,4-dicarboxyphenyl)propane, 2,2-bis{4'-(2,3- or 3,4-dicarboxyphenyl)phenyl}propane, 1,1,1,3,3,3-hexafluoro-2, 2-bis{4'-(2,3- or 3,4-dicarboxyphenoxy)phenyl}propane. Also a tetracarboxylic acid derivative of the formula:

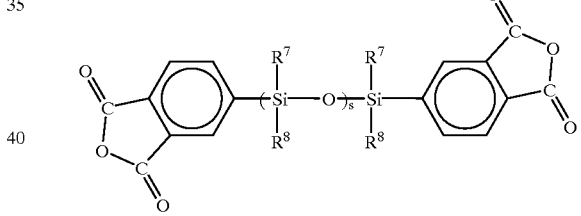

(IV)

wherein $R^7$ and $R^8$ are independently a monovalent hydrocarbon group, for example, hydrocarbyl groups such as an alkyl group having 1 to 4 carbon atoms, an aromatic group, e.g. a phenyl group; and s is an integer of 1 or more, is suitable.

Derivatives of tetracarboxylic acids include, for example, tetracarboxylic monoanhydrides, tetracarboxylic dianhydrides, tetracarboxylic chlorides, etc. As a partner of the reaction with a diamine, the use of tetracarboxylic dianhydrides is preferable from the viewpoint of reactivity. These tetracarboxylic acids or derivatives thereof can be used singly or as a mixture thereof. Among these tetracarboxylic acids or derivatives, oxydiphthalic acid, pyromellitic acid, 3,3',4,4'-benzophenonetetracarboxylic acid and 3,3',4,4'-biphenyltetracarboxylic acid are preferable.

As the diamine, those of the formula (III) are used as an essential component. It is possible to use diamines other than those of the formula (III) so far as the i-line transmittance and heat resistance are not much lowered.

Examples of the diamines other than those of the formula (III) are 4,4'-(or 3,4'-, 3,3'-, 2,4'- or 2,2'-)diaminodiphenyl ether, 4,4'-(or 3,4'-, 3,3'-, 2,4'-, or 2,2'-)diaminodiphenyl methane, 4,4'-(or 3,4-, 3,3'-, 2,4'-, or 2,2'-)diaminodiphenyl sulfone, 4,4'-(or 3,4'-, 3,3'-, 2,4'-, or 2,2'-)diaminodiphenyl sulfide, para-phenylenediamine, meta-phenylenediamine, p-xylylenediamine, m-xylylenediamine, o-tolidine, o-tolidinesulfone, 4,4'-methylene-bis(2,6-diethylaniline), 4,4'-methylene-bis(2,6-diisopropylaniline), 2,4-diaminomethylene, 1,5-diaminonaphthalene, 4,4'-benzophenonediamine, bis{4-(4'-aminophenoxy) phenyl}sulfone, 1,1,1,3,3,3-hexafluoro-2,2-bis(4-aminophenyl)propane, 2,2-bis{4-(4'-aminophenoxy) phenyl}propane, 3,3'-dimethyl-4,4'-diaminodiphenylmethane, 3,3',5,5'-tetramethyl-4,4'-diaminodiphenylmethane, bis{4-(3'-aminophenoxy) phenyl}sulfone, 2,2-bis(4-aminophenyl)propane, etc. These diamines can be used singly or as a mixture thereof.

It is also possible to use aliphatic diamines such as diaminopolysiloxanes of the formula:

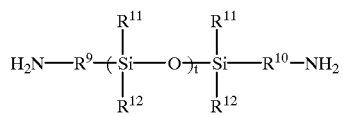

(V)

wherein $R^9$ and $R^{10}$ are independently a divalent hydrocarbon group, for example, hydrocarbyl groups such as an alkylene group having 1 to 4 carbon atoms, an arylene group, e.g. a phenylene group; $R^{11}$ and $R^{12}$ are independently a monovalent hydrocarbon group, for example, hydrocarbyl groups such as an alkyl group having 1 to 4 carbon atoms, an aromatic group, e.g. a phenyl group; and t is an integer of 1 or more.

It is preferable to use the diamino-polysiloxanes in an amount of 1 to 10% by weight, based on the total amount of diamines for improving adhesiveness. When the amount is more than 10% by weight, there is a tendency to lower thermal properties of the polyimide film.

It is preferable to use the diamine of the formula (III) in an amount of 10 to 100% by mole, more preferably 30 to 100% by mole, based on the total amount of diamines. When the using amount is less than 10% by mole, there is a tendency to lower the transmittance, to lower mechanical properties and thermal properties of the polyimide film.

The ring-opening polyaddition reaction can be carried out preferably in an organic solvent such as an aprotic polar solvent which can dissolve the produced polyimide precursor completely. Examples of such an aprotic polar solvent are N-methyl-2-pyrrolidone, N,N-dimethylacetamide, N,N-dimethylformamide, dimethylsulfoxide, tetramethyl urea, hexamethyl phosphoric acid triamide, γ-butyrolactone, etc.

In addition to the aprotic polar solvent mentioned above, it is possible to use ketones, esters, lactones, ethers, halogenated hydrocarbons, and hydrocarbons. Examples of these solvents are acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofuran, dichloromethane, 1,2-dichloroethane, 1,4-dichlorobutane, trichloroethane, chlorobenzene, o-dichlorobenzene, hexane, butane, octane, benzene, toluene, xylene, etc. These organic solvents can be used singly or as a mixture thereof.

The polyimide precursor of the present invention should be a compound having the repeating units of the formula (I-1) in an amount of preferably 10% by mole or more, more preferably 30% by mole or more. It will be understood that the remaining repeating units have the same formula as formula (I-1) with the exception that $R^2$ may be at least one other divalent organic group, such as,

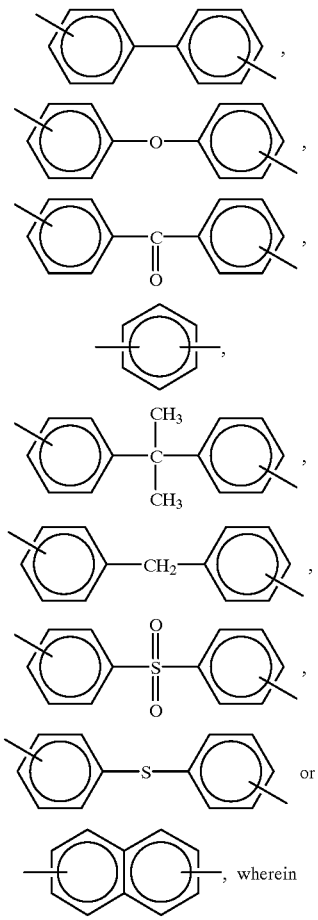

each hydrogen in aromatic ring in above formulae may be substituted by an alkyl group such as methyl, ethyl, propyl, buthyl, etc;
—$CH_2$—; and

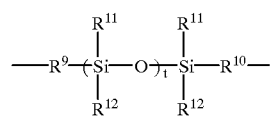

wherein $R^9$, $R^{10}$, $R^{11}$ and $R^{12}$ are the same as in the formula (V). When the content of the repeating units of the formula (I-1) is less than 10% by mole, there is a tendency to lower transparency and mechanical strength of the resulting polyimide film.

The weight-average molecular weight ($\overline{M}w$) of the polyimide precursor of the present invention is preferably 20,000 to 100,000. When the $\overline{M}w$ is lower than 20,000, there is a tendency to lower strength of the resulting polyimide thin film. On the other hand, when the $\overline{M}w$ is higher than 100,000, there is a tendency for the polyimide to exhibit high-viscosity and lower resolution. The $\overline{M}w$ can be measured by gel permiation chromatography using a carrier solvent such as dimethylformamide (DMF), dimethyl sulfoxide (DMSO), etc.

The polyimide of the present invention has repeating units represented by the formula:

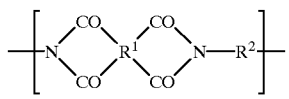
(1-2)

wherein $R^1$ and $R^2$ are as defined above.

Such a polyimide can be obtained by ring closure of the polyimide precursor, usably with heating.

It is preferable to heat at 80 to 450° C. When the heating temperature is lower than 80° C., there is a tendency to slow the ring closing reaction. On the other hand, when the heating temperature is higher than 450° C., there is a tendency to deteriorate the polyimide produced.

Heating time is preferably 10 to 100 minutes. When the heating time is less than 10 minutes, there is a tendency to slow the ring closing reaction. On the other hand, when the heating time is more than 100 minutes, there is a tendency to deteriorate the polyimide produced and to lower workability.

The polyimide can be used as an overcoating material on a semiconductor.

The photosensitive resin composition of the present invention comprises a photosensitive polyamide resin which can be obtained by imparting photosensitivity to the polyimide precursor.

As the method for imparting photosensitivity, there are a method of introducing an acrylic group by covalent bond into side chains (for example, carboxylic acid groups) of the polyimide precursor, a method of introducing an acrylic compound having one or more amino groups by ionic bonding with carboxylic acid groups of the polyimide precursor, a method of mixing a polyimide precursor, one or more reactive monomers, and a photosensitivity imparting agent such as a photo acid generator, a photo base generator, etc.

Accordingly, the photosensitive polyamide resin obtained by imparting photo sensitivity to the polyimide precursor has repeating units represented by the formula:

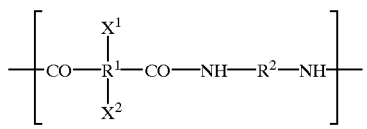
(I-3)

wherein $R^1$ and $R^2$ are as defined above; $X^1$ and $X^2$ are independently —COOR$^{13}$ —CONHR$^{14}$ or —COO$^-$R$^{15+}$, in which $R^{13}$, $R^{14}$ and $R^{15+}$ are independently a monovalent organic group having a vinyl group.

As $R^{13}$ and $R^{14}$, there can be used an alkenyl group such as vinyl, allyl, isopropenyl, etc. As $R^{15+}$, there may be an ammonium ion such as

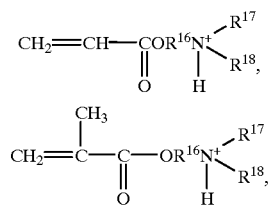

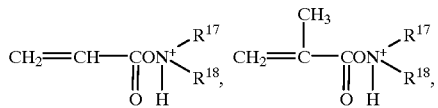

wherein $R^{16}$ is a alkylene group; $R^{17}$ and $R^{18}$ are alkyl groups.

The case of —COO$^-$R$^{15+}$ is obtained by the method of introducing an acrylic compound having one or more amino groups by ionic bonding with carboxylic acid groups of the polyimide precursor.

It will be appreciated that in the resin represented by the formula (I-3), some of the acid groups of the polyimide precursor may remain.

Considering easiness of volatile dispersion of photosensitive groups at the time of thermal imide ring closure and easiness of production of the photosensitive resin composition, it is preferable to use the method of introducing an acrylic compound having one or more amino groups into carboxylic acid groups of the polyimide precursor by ionic bonding.

As the acrylic compound having one or more amino groups, there can be used N,N-dimethylaminoethyl methacrylate, N,N-diethylaminoethyl methacrylate, N,N-dimethylaminopropyl methacrylate, N,N-diethylaminopropyl methacrylate, N,N-dimethylaminoethyl acrylate, N,N-diethylaminoethyl acrylate, N,N-dimethylaminopropyl acrylate, N,N-diethylaminopropyl acrylate, N,N-dimethylaminoethylacrylamide, N,N-dimethylaminoethylacrylamide, etc. These compounds can be used singly or as a mixture thereof.

The acrylic compound having one or more amino groups can preferably used in an amount of 1 to 200% by weight, more preferably 5 to 150% by weight, based on the weight of the polyimide precursor having repeating units of the formula (I-1). When the using amount is less than 1% by weight, there is a tendency to deteriorate photosensitivity. On the other hand, when the using amount is more than 200% by weight, there is a tendency to lower heat resistance and mechanical properties of the film produced.

The photosensitive resin composition may contain a photo initiator, if necessary.

Examples of the photo initiator are Michler's ketone, benzoin methyl ether, benzoin ethyl ether, benzoin isopropyl ether, 2-t-butylanthraquinone, 2-ethylanthraquinone, 4,4-bis(diethylamino)benzophenone, acetophenone, benzophenone, thioxanthone, 2,2-dimethoxy-2-phenylacetophenone, 1-hydroxycyclohexyl phenyl ketone, 2-methyl-[4-(methylthio)phenyl]-2-morpholino-1-propanone, benzyl, diphenyl disulfide, phenanthrenequinone, 2-isopropylthioxanthone, riboflavin tetrabutyrate, 2,6-bis(p-diethylamino-benzal)-4-methyl-4-azacyclohexanone, N-ethyl-N-(p-chloro-phenyl)glycine, N-phenyldiethanolamine, 2-(o-ethoxycarbonyl)oxyimino-1,3-diphenylpropanedione, 1-phenyl-2-(o-ethoxycarbonyl) oxyiminopropane-1-one, 3,3,4,4-tetra(t-butylperoxycarbonyl)benzophenone, 3,3-carbonyl bis(7-diethylamino coumalin), bis(cyclo-pentadienyl)-bis[2,6-difluoro-3-(pyri-1-yl)phenyl]-titanium, etc. These compounds can be used singly or as a mixture thereof.

The photo initiator can be used in an amount of preferably 0.01 to 30% by weight, more preferably 0.05 to 10% by weight, based on the weight of the polyimide precursor having repeating units of the formula (I-1). When the amount is less than 0.01% by weight, there is a tendency to lower the photosensitivity. On the other hand, when the amount is more than 30% by weight, there is a tendency to lower mechanical properties of the film produced.

The photosensitive resin composition may contain an addition polymerizable compound, if necessary.

Examples of the addition polymerizable compound are diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,4-butanediol diacrylate, 1,6-hexanediol diacrylate, 1,4-butandiol dimethacrylate, 1,6-hexanediol methacrylate, pentaerythritol triacrylate, pentaerythritol tetraacrylate, pentaerythritol trimethacrylate, pentaerythritol tetramethacrylate, styrene, divinylbenzene, 4-vinyltoluene, 4-vinypyridine, N-vinylpyrrolidone, 2-hydroxyethyl methylenebisacrylamide, N,N-dimethylacrylamide, N-methylolacrylamide, etc. These compounds can be used singly or as a mixture thereof.

The addition polymerizable compound can be used in an amount of preferably 1 to 200% by weight based on the weight of the polyimide precursor having repeating units of the formula (I-1). When the amount is less than 1% by weight, there is a tendency to deteriorate photosensitivity including solubility in a developing solution. On the other hand, when the amount is more than 200% by weight, there is a tendency to lower mechanical properties of the film formed.

The photosensitive resin composition may contain an azide compound, if necessary.

Examples of the azide compound are as follows.

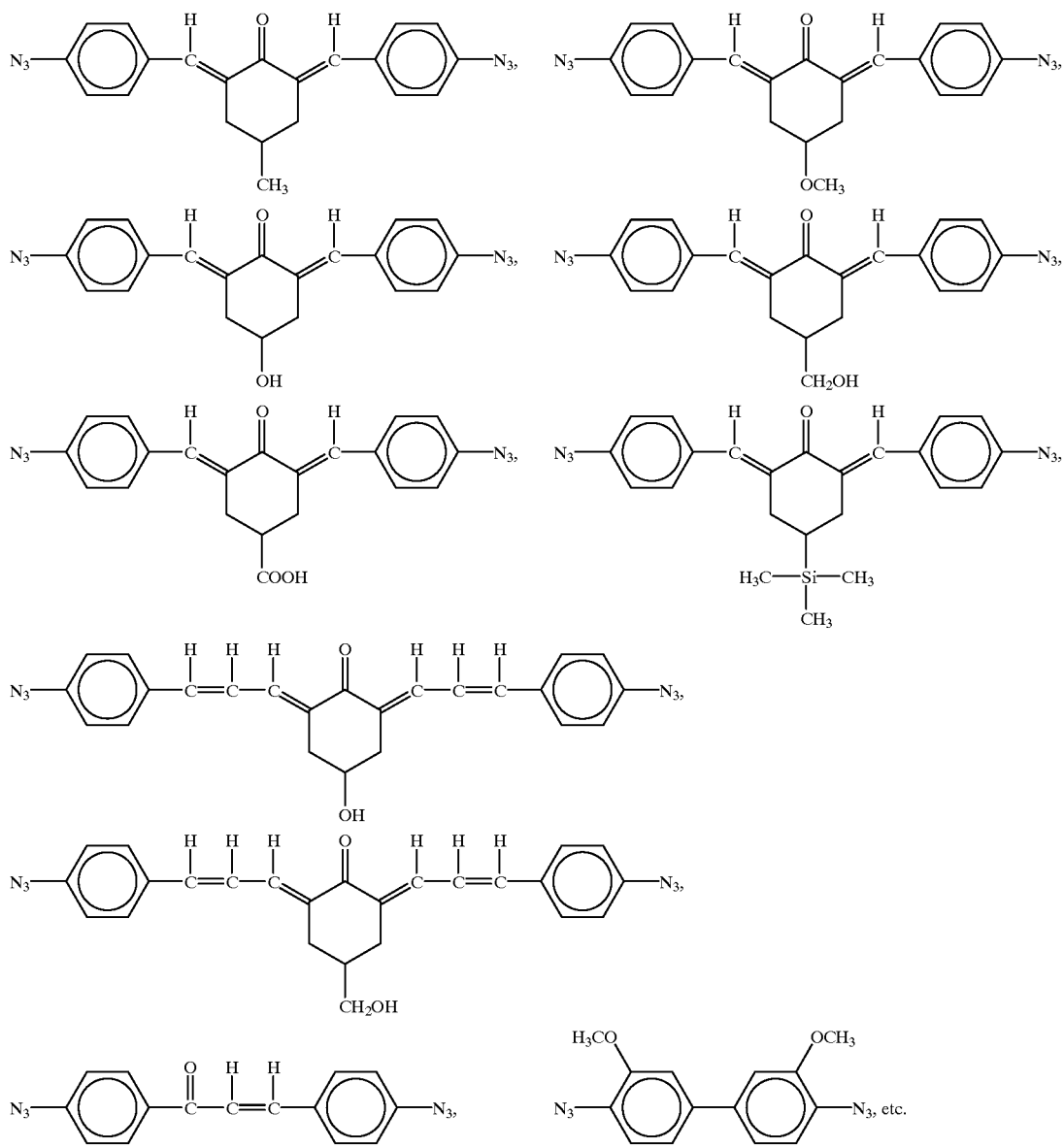

acrylate, 2-hydroxyethyl methacrylate, 1,3-acryloyloxy-2-hydroxypropane, 1,3-methacryloyloxy-2-hydroxypropane, These compounds can be used singly or as a mixture thereof.

The azide compound can be used in an amount of preferably 0.01 to 30% by weight, more preferably 0.05 to 10% by weight, based on the weight of the polyimide precursor having repeating units of the formula (I-1). When the amount is less than 0.01% by weight, there is a tendency to lower photosensitivity. On the other hand, when the amount is more than 30% by weight, there is a tendency to deteriorate mechanical properties of the film produced.

The photosensitive resin composition may further contain a radical polymerization inhibitor or a radical polymerization suppressing agent, in order to enhance storage stability.

Examples of the radical polymerization inhibitor or radical polymerization suppressing agent are p-methoxyphenol, diphenyl-p-benzoquinone, benzoquinone, hydroquinone, pyrogallol, phenothiazine, resorcinol, ortho-dinitrobenzene, para-dinitrobenzene, meta-dinitrobenzene, phenonthraquinone, N-phenyl-1-naphthylamine, N-phenyl-2-naphthylamine, cupferron, phenothiazine, 2,5-toluquinone, tannic acid, para-benzylaminophenol, nitrosoamines, etc. These compounds can be used singly or as a mixture thereof.

The radical polymerization inhibitor or the radical polymerization suppressing agent can be used in an amount of preferably 0.01 to 30% by weight, more preferably 0.05 to 10% by weight, based on the weight of the polyimide precursor having repeating units of the formula (I-1). When the amount is less than 0.01% by weight, there is a tendency to deteriorate storage stability. On the other hand, when the amount is more than 30% by weight, there is a tendency to lower photosensitivity and mechanical properties of the film produced.

The photosensitive resin composition may further contain one or more organic solvents which are exemplified in the ring-opening polyaddition reaction to produce the polyimide precursor mentioned above. The organic solvent can be used in an amount of 10 to 99 parts by weight, preferably 20 to 97 parts by weight, more preferably 30 to 95 parts by weight, per 100 parts by weight of a total of the components of the photosensitive resin composition other than the organic solvent.

The photosensitive resin composition is coated on a substrate such as a silicon wafer, a metallic substrate, a ceramic substrate, etc. by a dip method, a spray method, a screen printing method, a spin coating method, etc., followed by drying with heating to remove almost of the organic solvent to give a coated film (polyimide precursor film) having no sticking properties.

On the coated film, a mask having the predetermined pattern is formed thereon, followed by exposure to actinic light or actinic rays through the mask. Unexposed portions are removed by a suitable developing solution to give a predetermined relief pattern.

The photosensitive resin composition is designed for an i-line stepper. But as the actinic light or actinic rays, there can be used a contact/proximity exposing device using an ultra-high pressure mercury lamp, a mirror projection exposing device, a g-line stepper, and ultraviolet light, a visible light source, X-rays, electron beams, etc. in addition to the i-line stepper.

As the developing solution, there can be used a good solvent (e.g. N,N-dimethylformamide, N,N-dimethylacetamide, N-methyl-2-pyrrolidone, etc.), a mixed solvent of the above-mentioned good solvent and a poor solvent (e.g. a lower alcohol, water, an aromatic hydrocarbon, etc.), a basic solution (an aqueous solution of tetramethylammonium hydroxide, an aqueous solution of triethanolamine, etc.), etc.

After the development, rinsing is conducted using water or poor solvent, if necessary, followed by drying at about 100° C., to give a more stable pattern.

When the relief pattern (polyimide precursor pattern) is heated for imidization, there can be obtained a heat resistant patterned polyimide. At this time, it is preferable to heat the relief pattern at a temperature of 150° to 500° C., more preferably 200° to 400° C. When the heating temperature is lower than 150° C., there is a tendency to lower mechanical properties and thermal properties of the polyimide film. On the other hand, when the heating temperature is higher than 500° C., there is a tendency to lower mechanical properties and thermal properties of the polyimide film. Further, the heating time is preferably 0.05 to 10 hours. When the heating time is less than 0.05 hour, there is a tendency to lower mechanical properties and thermal properties of the polyimide film. On the other hand, when the heating time is more than 10 hours, there is a tendency the lower mechanical properties and thermal properties of the polyimide film.

As mentioned above, the photosensitive resin composition can be used for forming surface protective films for semiconductors for forming a polyimide pattern as a mask which is used when an inorganic film of SiN, SiO, etc. is subjected to working such as dry etching, wet etching, etc., interlaminar insulating films for multilayer wiring boards, etc.

The semiconductor device of the present invention can be obtained by using the photosensitive resin composition. Therefore, the semiconductor device may have a polyimide film obtained from the photosensitive resin composition.

The semiconductor device can be produced by using a pattern of polyimide film obtained from the photosensitive resin composition as a mask, and conducting, for example, passivation processing applying dry etching.

More in detail, when a film of an inorganic material such as SiO, SiN, etc. which is used to prevent chemical influences from outside and formed on wiring, is perforated by dry etching in the production of a semiconductor device, a polyimide film pattern obtained from the photosensitive resin composition is used as a mask for dry etching. In order to prevent physical influences from a sealing agent, a surface protective film made from polyimide is formed on the passivation film.

The present invention is illustrated by way of the following Examples.

SYNTHESIS EXAMPLES 1 TO 8

In a 100-ml flask equipped with a stirrer, a thermometer and a nitrogen-introducing pipe, a diamine component shown in Table 1 and N-methyl-2-pyrrolidone were placed and stirred at room temperature under a nitrogen steam for dissolution. Then, an acid component shown in Table 1 was added to the flask and stir red for 5 hours to give a viscous solution of polyimide precursor.

The resulting solution was further heated at 70° C. for 5 hours for adjusting the viscosity to 80 poises (solid content 25% by weight) to give a solution of polyimide precursor (PI-1 to PI-8). In Table 1, using amounts of the diamine components, the acid components and N-methyl-2-pyrrolidone are also listed.

The viscosity was measured by using a E-type viscometer (EHD type, a trade name, mfd. by TOKIMEC INC.) at 25° C. and 2.5 r.p.m.

When the solutions of polyimide precursors (PI-1 to PI-8) were dried and subjected to measurement of infrared absorption spectra (JIR-100 type, mfd. by JEOL Ltd.) by the KBr method, the absorption of C=0 (the bond between carbon and oxygen) due to the amide group near 1600 cm$^{-1}$ and that of N—H near 3300 cm$^{-1}$ were admitted.

TABLE 1

| Synthesis Example No. | Diamine component (Using amount) (g/g) | Acid component (Using amount) (g) | N-methyl-2-pyrrolidone (Using amount) (g) | Polyimide precursor |
|---|---|---|---|---|
| 1 | DMAP/LP-7100 (9.6198/0.5927) | ODPA (14.7969) | 75.0282 | PI-1 |
| 2 | DMAP/LP-7100 (9.7610/0.6014) | ODPA/s-BPDA (7.5070/7.1198) | 74.9676 | PI-2 |
| 3 | DMAP/3,4'-DDE/LP-7100 (4.7574/4.9859/0.6188) | s-BPDA (14.6516) | 75.0411 | PI-3 |
| 4 | TMAP/LP-7100 (10.2745/0.5592) | ODPA (13.9594) | 74.3793 | PI-4 |
| 5 | TMAP/LP-7100 (10.5029/0.5716) | s-BPDA (13.5336) | 73.8293 | PI-5 |
| 6 | 4,4'-DDE/LP-7100 (9.5683/0.6250) | s-BPDA (14.7987) | 74.976 | PI-6 |
| 7 | OTD/LP-7100 (9.9223/0.6114) | s-BPDA (14.4750) | 75.0261 | PI-7 |
| 8 | OTD/LP-7100 (9.6198/0.5927) | ODPA (14.7969) | 75.0282 | PI-8 |

Note) DMAP:

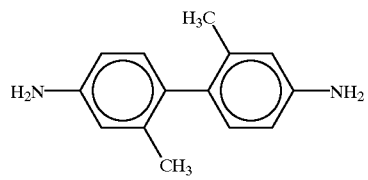

TMAP:

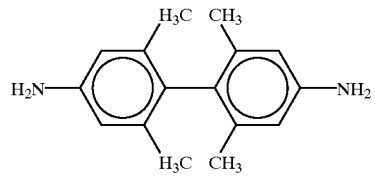

LP-7100:

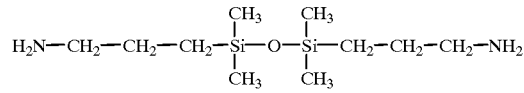

3,4'-DDE:

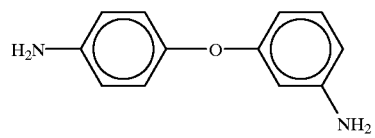

OTD:

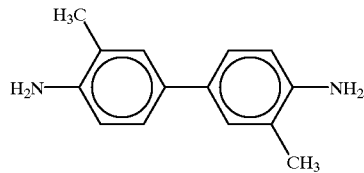

4,4'-DDE:

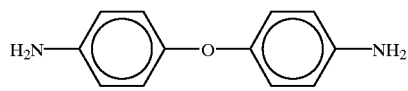

ODPA:

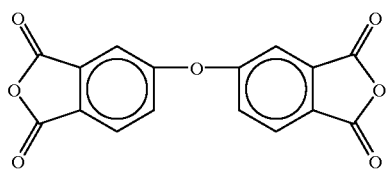

s-BPDA:

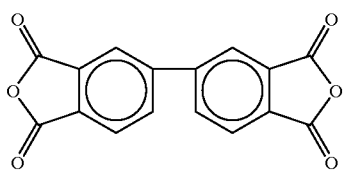

EXAMPLES 1–5 AND COMPARATIVE EXAMPLES 1 TO 3

Uniform photosensitive resin compositions of Examples 1 to 5 and Comparative Examples 1 to 3 were prepared by adding to 10 g of each solution of polyimide precursors (PI-1 to PI-8) obtained in Synthesis Examples 1 to 8, 0.027 g of 2,6-bis(4'-azidobenzal)-4-carboxycyclohexanone (CA), 0.027 g of 4,4'-bis(diethylamino)benzophenone (EAB), and 0.054 g of 1-phenyl-2-(o-ethoxycarbonyl)oxyiminopropan-1-one (PDO), followed by addition of dimethylaminopropyl methacrylate (MDAP) in an amount equivalent to the carboxyl group of the polyimide precursor, with stirring.

MDAP:

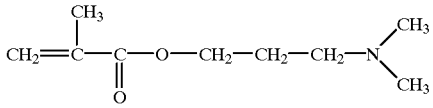

CA:

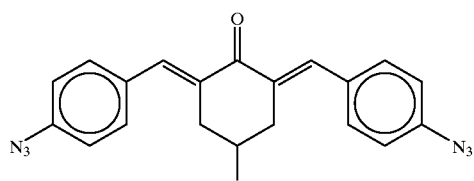

EAB:

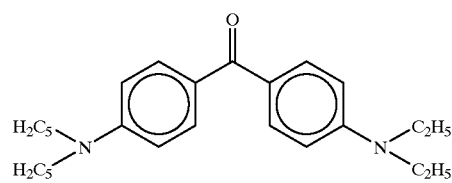

PDO:

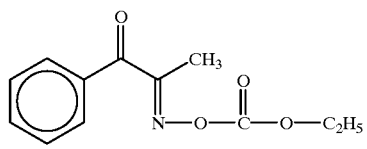

Each photosensitive resin composition solution was filtered and spin coated on a silicon wafer.

Then, using a hot plate, the coated composition was heated at 100° C. for 150 seconds to form a film of 23 μm thick. Using the resulting film as a pattern mask, exposure to light was conducted by using an i-line stepper.

Then, the exposure film was heated at 100° C. for 60 seconds and subjected to paddle development using a mixed solvent of N-methyl-2-pyrrolidone/water (75/25 weight ratio), followed by heating at 100° C. for 30 minutes, 200° C. for 30 minutes, and 350° C. for 60 minutes to give a polyimide relief pattern.

A part of the resulting relief pattern was subjected to measurement of infrared absorption spectra by the KBr method. As a result, specific absorption of imide was admitted near 1780 cm$^{-1}$.

Transmittance of the polyimide precursors (PI-1 to PI-8) obtained in Synthesis Examples 1 to 8, resolution, glass transition temperatures and adhesiveness of relief patterns thus obtained were evaluated. The results are shown in Table 2.

The transmittance was evaluated by spin coating a resin solution of polyimide precursor (PI-1 to PI-8) on a substrate (MICRO COVER GLASS, mfd. by Matsunami Glass Ind., Ltd.), drying at 85° C. for 3 minutes and 105° C. for 3 minutes to give a coated film, which was subjected to the measurement using a spectrophotometer.

The resolution was evaluated by using a through hole test pattern and measuring the minimum size of developable through hole.

The glass transition temperature was evaluated by coating a photosensitive resin composition on a silicon wafer, heating at 100° C. for 30 minutes, 200° C. for 30 minutes, and under a nitrogen atmosphere at 350° C. for 60 minutes to give a coated film (film thickness 10 μm) and measuring the glass transition temperature using a TMA-1 apparatus (a trade name, mfd. by Perkin-Elmer Corp.).

The adhesiveness was evaluated by coating a photosensitive resin composition on a silicon wafer, heating at 100° C. for 30 minutes, 200° C. for 30 minutes, and under a nitrogen atmosphere at 350° C. for 60 minutes to give a coated film (film thickness 10 μm), and subjected to a cross cut test using a Pressure Cooker Tester (conditions: at 121° C., 2 atmospheres and 100 hours).

The cross cut test was carried out by cutting 100 squares, each square having a size of 1 mm×1 mm with a cutting knife, peeling with a cellophane tape according to JIS K 5400, and counting the number of retaining squares per 100 squares.

The coefficient of thermal expansion (CTE) was measured by using a TMA-1 apparatus (conditions: sample size: 2×15 mm, heating rate: 10° C./min. (in air), loading weight: 10 g, CTE value: measured at 100–150° C.).

TABLE 2

| Example No. | Polyimide precursor | Transmittance (%) | Resolution | Glass transition temperature (° C.) | Adhesiveness | CTE (ppm/° C.) |
| --- | --- | --- | --- | --- | --- | --- |
| Example 1 | PI-1 | 28 | 6 μm (good) | 300 | 100/100 | 20 |
| Example 2 | PI-2 | 23 | 8 μm (good) | 320 | 100/100 | 18 |
| Example 3 | PI-3 | 22 | 8 μm (good) | 350 | 100/100 | 25 |
| Example 4 | PI-4 | 55 | 6 μm (good) | 330 | 100/100 | 10 |
| Example 5 | PI-5 | 34 | 6 μm (good) | 380 | 100/100 | 7 |
| Comparative Example 1 | PI-6 | Less than 0.1 | No good | 270 | 100/100 | 50 |
| Comparative Example 2 | PI-7 | Less than 0.1 | No good | 380 | 100/100 | 20 |
| Comparative Example 3 | PI-8 | 10 | No good | 300 | 100/100 | 47 |

As mentioned above, the polyimide precursor of the present invention is good in light transmittance and suitable for preparing a photosensitive resin composition, and shows excellent mechanical properties, thermal properties by properly selecting substituents.

The polyimide obtained from the polyimide precursor shows excellent mechanical properties and thermal properties, e.g. excellent heat resistance.

The photosensitive resin composition of the present invention is excellent in image formation and particularly suitable for pattern formation using an i-line stepper. The polyimide pattern obtained by the photosensitive resin composition is excellent in resolution, dimensional accuracy and resistance to dry etching, so that it is suitable as a mask for passivation processing.

What is claimed is:

1. A process for producing a semiconductor device, which comprises:

(a) forming a polyimide precursor film on a substrate using a photosensitive resin composition comprising a photosensitive polyamide resin which is obtained by imparting photosensitivity to a polyimide precursor having repeating units of the formula:

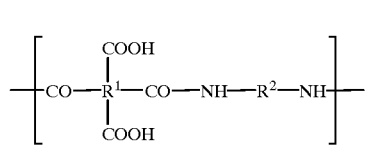
(I-1)

wherein $R^1$ is a tetravalent organic group; and $R^2$ is a group of the formula:

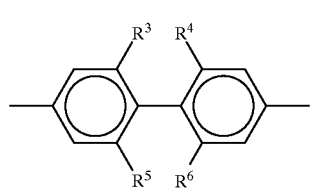
(II)

wherein $R^3$, $R^4$, $R^5$ and $R^6$ are independently a hydrogen atom or a monovalent organic group, and at least two of $R^3$ to $R^6$ are independently a monovalent organic group;

(b) setting up a mask having a pattern on a polyimide precursor film;

(c) exposing the polyimide precursor film to monochromatic light of i-line having a wavelength of 365 nm, using an i-line stepper, through the mask;

(d) forming a polyimide precursor pattern by removing unexposed portions of the polyimide precursor film, followed by heating for imidization to make a polyimide pattern; and (e) conducting passivation processing applying dry etching using the polyimide pattern as a mask.

2. The process according to claim 1, wherein $R^1$ in the formula (I-1) is a group of the formula:

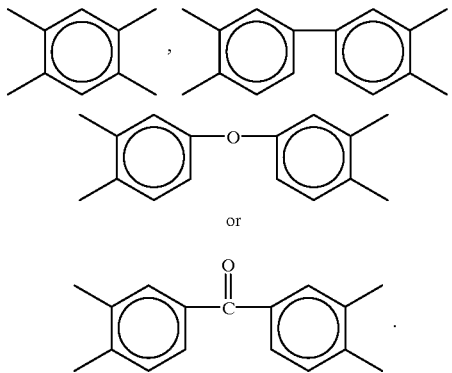

3. The process according to claim 1, wherein the monovalent organic group represented by $R^3$ to $R^6$ is an alkyl group having 1 to 5 carbon atoms, a halogenated alkyl group having 1 to 5 carbon atoms, an alkoxy group having 1 to 5 carbon atoms, or a halogenated alkoxy group having 1 to 5 carbon atoms.

4. The process according to claim 1, wherein $R^2$ in the formula (I-1) is a group of the formula:

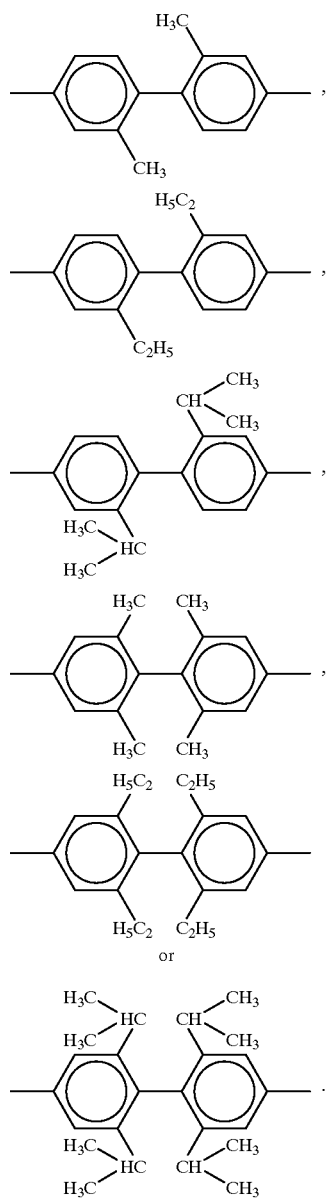

5. The process according to claim 1, wherein an amount of the repeating units of the formula (I-1) is 10% by mole or more, with the remaining repeating units having a same formula as formula (I-1) with the exception that $R^2$ is another divalent organic group selected from the group consisting of:

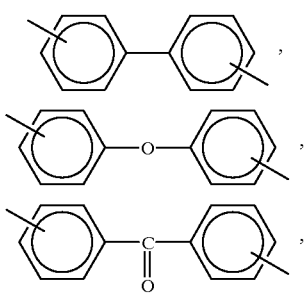

-continued

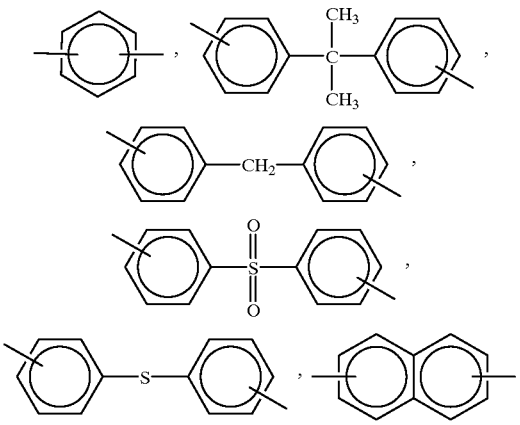

(each hydrogen in the aromatic rings in the above formulae may be substituted by an alkyl group), —CH$_2$—, and

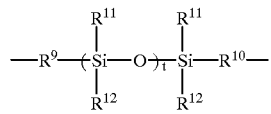

wherein R$^9$ and R$^{10}$ are independently a divalent hydrocarbyl group; R$^{11}$ and R$^{12}$ are independently a monovalent hydrocarbyl group; and t is an integer of 1 or more.

6. The process according to claim 1, wherein said substrate includes a silicon wafer.

7. The process according to claim 1, wherein said mask is a mask for forming a surface protective film for the semiconductor device.

8. The process according to claim 1, wherein said mask is a mask used for forming a polyimide pattern used as an etching mask when etching an inorganic film in forming the semiconductor device.

9. The process according to claim 1, wherein R$^2$ in the formula (I-1) is a group of the formula:

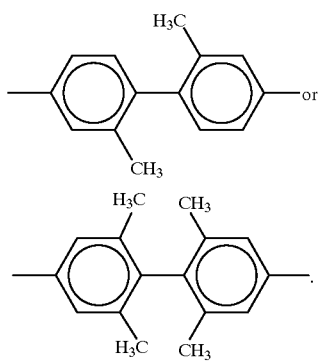

10. The process according to claim 9, wherein R$^2$ in the formula (I-1) is a group of the formula:

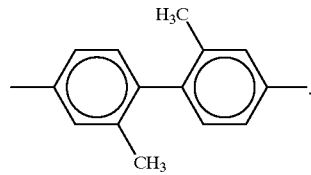

11. The process according to claim 1, wherein the polyimide precursor has a weight average molecular weight in a range of 20,000 to 100,000.

12. A process for producing a relief pattern, which comprises:

(a) forming a polyimide precursor film on a substrate using a photosensitive resin composition comprising a photosensitive polyamide resin which is obtained by imparting photosensitivity to a polyimide precursor having repeating units of the formula:

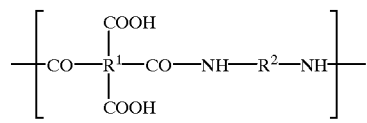

wherein R$^1$ is a tetravalent organic group; and R$^2$ is a group of the formula:

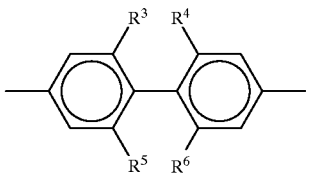

wherein R$^3$, R$^4$, R$^5$ and R$^6$ are independently a hydrogen atom or a monovalent organic group, and at least two of R$^3$ to R$^6$ are independently a monovalent organic group;

(b) setting up a mask having a pattern on a polyimide precursor film;

(c) exposing the polyimide precursor film to monochromatic light of i-line having a wavelength of 365 nm, using an i-line stepper, through the mask; and (d) forming a polyimide precursor pattern by removing unexposed portions of the polyimide precursor film, followed by heating for imidization to make a polyimide pattern.

13. The process according to claim 12, wherein R$^1$ in the formula (I-1) is a group of the formula:

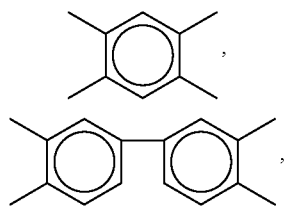

-continued

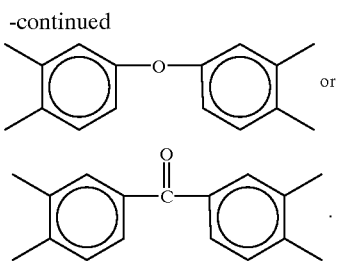

14. The process according to claim 12, wherein the monovalent organic group represented by $R^3$ to $R^6$ is an alkyl group having 1 to 5 carbon atoms, a halogenated alkyl group having 1 to 5 carbon atoms, an alkoxy group having 1 to 5 carbon atoms, or a halogenated alkoxy group having 1 to 5 carbon atoms.

15. The process according to claim 12, wherein $R^2$ in the formula (I-1) is a group of the formula:

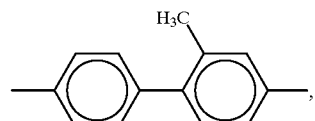

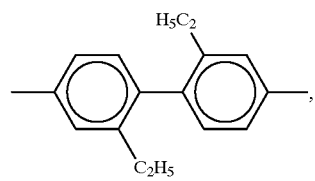

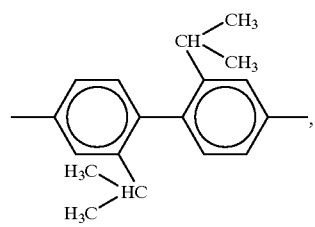

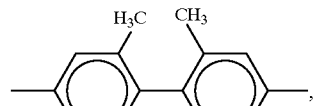

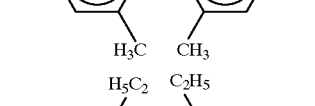

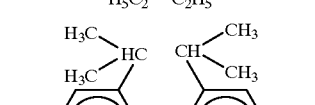

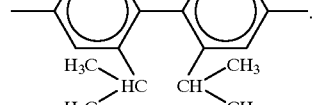

16. The process according to claim 12, wherein an amount of the repeating units of the formula (I-1) is 10% by mole or more, with the remaining repeating units having a same formula as formula (I-1) with the exception that $R^2$ is another divalent organic group selected from the group consisting of:

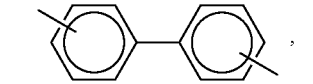

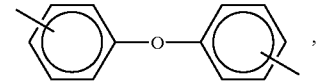

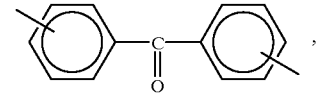

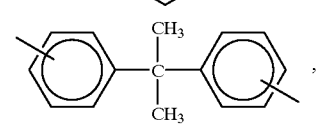

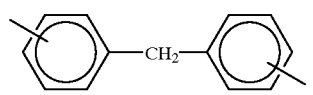

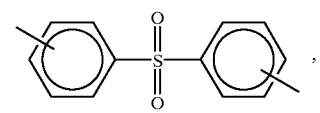

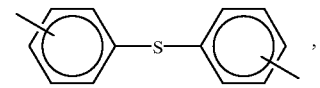

(each hydrogen in the aromatic rings in the above formulae may be substituted by an alkyl group), —CH$_2$—, and

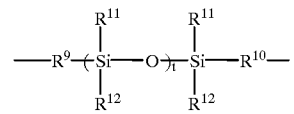

wherein $R^9$ and $R^{10}$ are independently a divalent hydrocarbyl group; $R^{11}$ and $R^{12}$ are independently a monovalent hydrocarbyl group; and t is an integer of 1 or more.

17. The process according to claim 12, wherein said substrate includes a silicon wafer.

18. The process according to claim 12, wherein said mask is a mask for forming a surface protective film for the semiconductor device.

19. The process according to claim 12, wherein said mask is a mask used for forming a polyimide pattern used as an etching mask when etching an inorganic film in forming the semiconductor device.

20. The process according to claim 12, wherein $R^2$ in the formula (I-1) is a group of the formula:

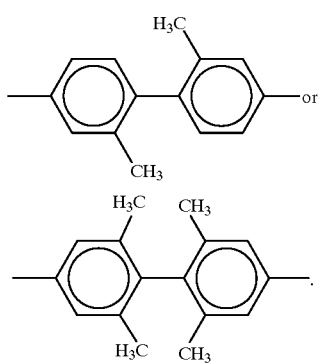
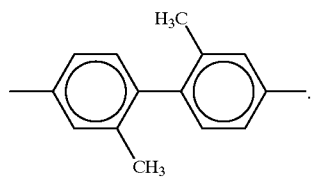
21. The process according to claim 20, wherein $R^2$ in the formula (I-1) is a group of the formula:
22. The process according to claim 12, wherein the polyimide precursor has a weight average molecular weight in a range of 20,000 to 100,000.
* * * * *